(12) United States Patent
Kowalewski

(10) Patent No.: US 11,424,903 B1
(45) Date of Patent: Aug. 23, 2022

(54) DRIFT TRACKING USING AN ANALOG DELAY LINE DURING CLOCK-DATA RECOVERY

(71) Applicant: Synopsys, Inc., Mountain View, CA (US)

(72) Inventor: Marcin Pawel Kowalewski, Gdynia (PL)

(73) Assignee: Synopsys, Inc., Mountain View, CA (US)

( * ) Notice: Subject to any disclaimer, the term of this patent is extended or adjusted under 35 U.S.C. 154(b) by 208 days.

(21) Appl. No.: 16/987,284

(22) Filed: Aug. 6, 2020

Related U.S. Application Data

(60) Provisional application No. 62/884,224, filed on Aug. 8, 2019.

(51) Int. Cl.
*H04L 7/00* (2006.01)
*H03K 5/1534* (2006.01)
*H03K 5/14* (2014.01)
*H03K 5/00* (2006.01)

(52) U.S. Cl.
CPC ............. *H04L 7/0037* (2013.01); *H03K 5/14* (2013.01); *H03K 5/1534* (2013.01); *H04L 7/0087* (2013.01); *H04L 7/0091* (2013.01); *H03K 2005/00026* (2013.01)

(58) Field of Classification Search
CPC ................... H03K 5/1534; H03K 5/14; H03K 2005/00026; H04L 7/0037; H04L 7/0091; H04L 7/0087; H04L 7/0331; H04L 7/0332
USPC ......................................................... 375/354
See application file for complete search history.

(56) References Cited

U.S. PATENT DOCUMENTS

| | | | | |
|---|---|---|---|---|
| 2002/0051510 A1* | 5/2002 | Noguchi | ............. | H03D 13/004 375/376 |
| 2018/0164163 A1* | 6/2018 | Pandiri | ................ | G01K 15/005 |

\* cited by examiner

*Primary Examiner* — Leila Malek
(74) *Attorney, Agent, or Firm* — Park, Vaughan, Fleming & Dowler LLP; Laxman Sahasrabuddhe

(57) ABSTRACT

A clock recovery circuit may include a first circuit to produce an output signal that is a logical combination of an edge detection signal and a clock signal. At least some transitions in the edge detection signal may correspond to transitions in a set of data signals. The clock recovery circuit may also include a second circuit to average the output signal to produce a voltage, and a third circuit to add a variable delay to the clock signal based on the voltage.

20 Claims, 4 Drawing Sheets

DRIFT TRACKING USING AN ANALOG DELAY LINE DURING CLOCK-DATA RECOVERY

RELATED APPLICATION

This application claims benefit of U.S. Provisional Application Ser. No. 62/884,224, filed on 8 Aug. 2019, the contents of which are herein incorporated by reference in their entirety for all purposes.

TECHNICAL FIELD

The present disclosure generally relates to integrated circuit (IC) design. More specifically, the present disclosure relates to drift tracking using an analog delay line during clock-data recovery (CDR).

BACKGROUND

A data signal may be transmitted by a transmitter circuit and received by a receiver circuit over a communication channel. The transmitter circuit may use a clock signal to generate and transmit the data signal based on data that is desired to be communicated to the receiver circuit. The receiver circuit may use a CDR circuit to extract the clock signal that is embedded in the data signal, and use the extracted clock signal to decode the data from the data signal.

SUMMARY

Some embodiments described herein may feature a clock recovery circuit that includes a first circuit to produce an output signal that is a logical combination of an edge detection signal and a clock signal. At least some transitions in the edge detection signal may correspond to transitions in a data signal. The circuit may also include a second circuit to average the output signal to produce a voltage, and a third circuit to add a variable delay to the clock signal based on the voltage.

In some embodiments, the second circuit may include an amplifier having a first input, a second input, and an output, and a shunt capacitor coupled between the first input and ground. The output signal produced by the first circuit may be provided to the first input of the second circuit through a resistance, and a reference voltage may be provided to the second input of the second circuit.

In some embodiments, the third circuit may include a first delay element coupled in series with a second delay element, where the first delay element may be digitally controlled, and the second delay element may be controlled based on the voltage outputted by the amplifier in the second circuit. In some embodiments, the second delay element in the third circuit may precisely and continuously track changes in delays and/or clock frequencies due to voltage drift, temperature drift, or both voltage drift and temperature drift.

In some embodiments, the clock recovery circuit may include a fourth circuit to generate the edge detection signal based on the data signal received at three terminals over respective interconnects (or signal lines), where at least a pair of interconnects of the three interconnects includes a transition between successive symbols encoded in the data signal. Specifically, in some embodiments, 16 bits of data may be encoded using a sequence of seven symbols in the data signal (which is received over the three interconnects or signal lines). In some embodiments, the fourth circuit may detect a transition in a differential signal corresponding to any pair of interconnects of the three interconnects.

Some embodiments may feature an apparatus that includes a set of terminals to receive a data signal, a first circuit to generate a first signal based on the data signal, a second circuit to produce an output signal that is a logical combination of the first signal and a clock signal, a third circuit to average the output signal to produce a voltage, and a fourth circuit to add a variable delay to the clock signal based on the voltage.

BRIEF DESCRIPTION OF THE FIGURES

The disclosure can be understood based on the detailed description given below and the accompanying figures. The figures are for illustrative purposes, and do not limit the scope of the disclosure. Furthermore, the figures are not necessarily drawn to scale.

DETAILED DESCRIPTION

Figure 1:
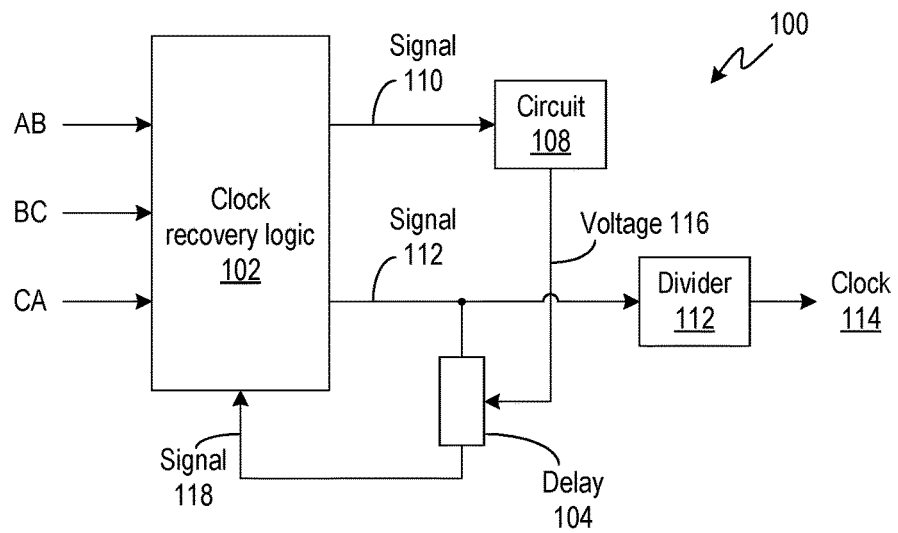
FIG. 1 illustrates a clock recovery circuit with analog drift tracking in accordance with some embodiments described herein.

High speed interfaces may use differential signals in which a signal value is represented by a difference between the voltages of two signal lines or interconnects. The signal lines or interconnects may be electrically connected to respective input terminals of a circuit. In this disclosure, the terms "signal line," "interconnect," and "terminal" are used interchangeably in the context of data signals. Without loss of generality, for a given pair of terminals, one terminal may be denoted as the positive terminal and the other terminal may be denoted as the negative terminal. A logical "1" may correspond to the case when the voltage difference between the positive and negative terminals (i.e., the voltage of the positive terminal minus the voltage of the negative terminal) is greater than zero. A logical "0" may correspond to the case when the voltage difference between the positive and the negative terminals is less than zero.

The mobile industry processing interface (MIPI) C-PHY[SM] standard is a high speed interface standard that uses three interconnects, which may be referred to as A, B and C. Specifically, the voltages of the three interconnects may map to a particular symbol selected from five possible symbols. In other words, the MIPI C-PHY[SM] may use a base-5 encoding system.

In particular, 16 bits of data may be encoded using seven consecutive symbols in the MIPI C-PHY[SM] data signal. Data may be encoded using the voltages of the three signal lines such that at least one transition occurs in the differential pairs AB, AC, or BC between any two successive symbols. In this manner, the clock information may be embedded in the data signal.

A CDR circuit may be used at a MIPI C-PHY$^{SM}$ receiver to extract the clock signal that is embedded in the data signal. The clock signal may then be delayed by a specific amount, and the delayed version of the clock signal may be used to capture (or sample) the data signal. MIPI C-PHY$^{SM}$ specification defines a receiver eye diagram based on the first (i.e., earliest) data signal edge that is detected in the data signals AB, BC, and CA. In particular, the MIPI C-PHY$^{SM}$ specification suggests sampling the data signal at a delay of 0.5 unit interval (UI) from the first (i.e., earliest) data signal edge, where a clock cycle is 1 UI.

The CDR circuit in the receiver may use a preamble pattern sent by the transmitter to determine the UI value, and then use the determined UI value to calculate the 0.5 UI delay for capturing the data signal. The preamble may be sent once at the beginning of data transmission, but the packet size that is sent during data transmission may last for a long enough time for the delay and/or clock frequency to drift due to, for example, changes in operating temperature, voltage, or both. A digitally controlled delay may be used to solve the drift problem. However, such approaches suffer from quantization errors (due to the gap between the delay values of adjacent digital codes), and the digitally controlled delay is changed when the digital code is updated, which may not be continuous and may not occur frequently enough.

Embodiments described in this disclosure may feature clock recovery circuitry that can continuously and precisely track delay drift that may be caused by, for example, changes in operating temperature, voltage, or both. Specifically, some embodiments described herein may use an analog controlled delay line to continuously and precisely track delay drift or clock frequency drift in a CDR circuit.

Advantages of embodiments disclosed herein include, but are not limited to, ability to precisely and continuously track changes in the UI or delay, ability to seamlessly adjust to changes in the bit-rate, reduction of power and area of circuitry required for tracking drift, and a simpler and robust circuit design that is easier to verify.

FIG. 1 illustrates a clock recovery circuit with analog drift tracking in accordance with some embodiments described herein. Circuit 100 may include clock recovery logic 102, circuit 108, divider 112, and delay 104. Clock recovery logic 102 may receive differential data signals AB, BC, and CA. Specifically, a data signal may be received over three signal lines or interconnects referred to as "A," "B," and "C." The data signal AB may correspond to the differential signal between signal lines "A" and "B." The data signal BC may correspond to the differential signal between signal lines "B" and "C." The data signal CA may correspond to the differential signal between signal lines "C" and "A."

Clock recovery logic 102 may produce signals 110 and 112. Signal 112, when passed through divider 112, may produce recovered clock signal 114. Signal 110 may be provided to circuit 108 to produce voltage 116, which may be provided as a control input to delay 104. Delay 104 may receive signal 112 as input, and produce a delayed version of signal 112 as output (which is shown as signal 118 in FIG. 1). The amount of delay added by delay 104 to signal 112 may be controlled by voltage 116. In some embodiments, delay 104 may be a voltage controlled delay line that varies the amount of delay based on voltage 116.

In some embodiments, delay 104 may include a digitally controlled delay line (not shown) and a voltage controlled delay line coupled in series. The digitally controlled delay line may receive a digital code value (not shown) that may be used to set a delay value of the digitally controlled delay line. The digital code value may be changed by a controller (not shown) at a desired update rate (e.g., each clock cycle). In these embodiments, the analog voltage controlled delay line may be used to fine tune the total delay added by delay 104.

In some embodiments, the duty cycle of signal 110 may correspond to a ratio of the delay added by delay 104 to signal 112 and the clock period of signal 112. For example, if the clock period of signal 112 is 1 UI, and the duty cycle of signal 110 is 50%, then that may correspond to delay 104 adding a delay of 0.5 UI to signal 112.

Clock recovery logic 102, circuit 108, and delay 104 may form a negative analog feedback loop that causes the amount of delay that is being added by delay 104 to be equal to a desired fraction of the clock period of signal 112. Specifically, circuit 108 may generate voltage 116 that corresponds to a duty cycle of signal 110. Providing voltage 116 as a control input to delay 104 may cause delay 104 to add a corresponding amount of delay to signal 112. The delayed version of signal 112 (i.e., signal 118) may be used to clock circuitry in clock recovery logic 102, which may affect the duty cycle of signal 110, thereby forming the negative feedback loop. In some embodiments, circuit 108 may receive a reference voltage value (not shown in FIG. 1) that may be used to control the ratio of the delay added by delay 104 to signal 112 and the clock period of signal 112. In other words, the reference voltage may be used to control the location in the eye pattern where the CDR circuit captures the data signal.

In some embodiments, the reference voltage may be selected such that the delay being added by delay 104 is substantially equal to half of the clock period of signal 112 (i.e., the delay of delay 104 may be substantially equal to 0.5 UI, where the clock period of signal 112 is equal to 1 UI). In this manner, the negative feedback loop formed by clock recovery logic 102, circuit 108, and delay 104 may provide a precise and continuous analog delay control of the delay added by delay 104.

Figure 2:
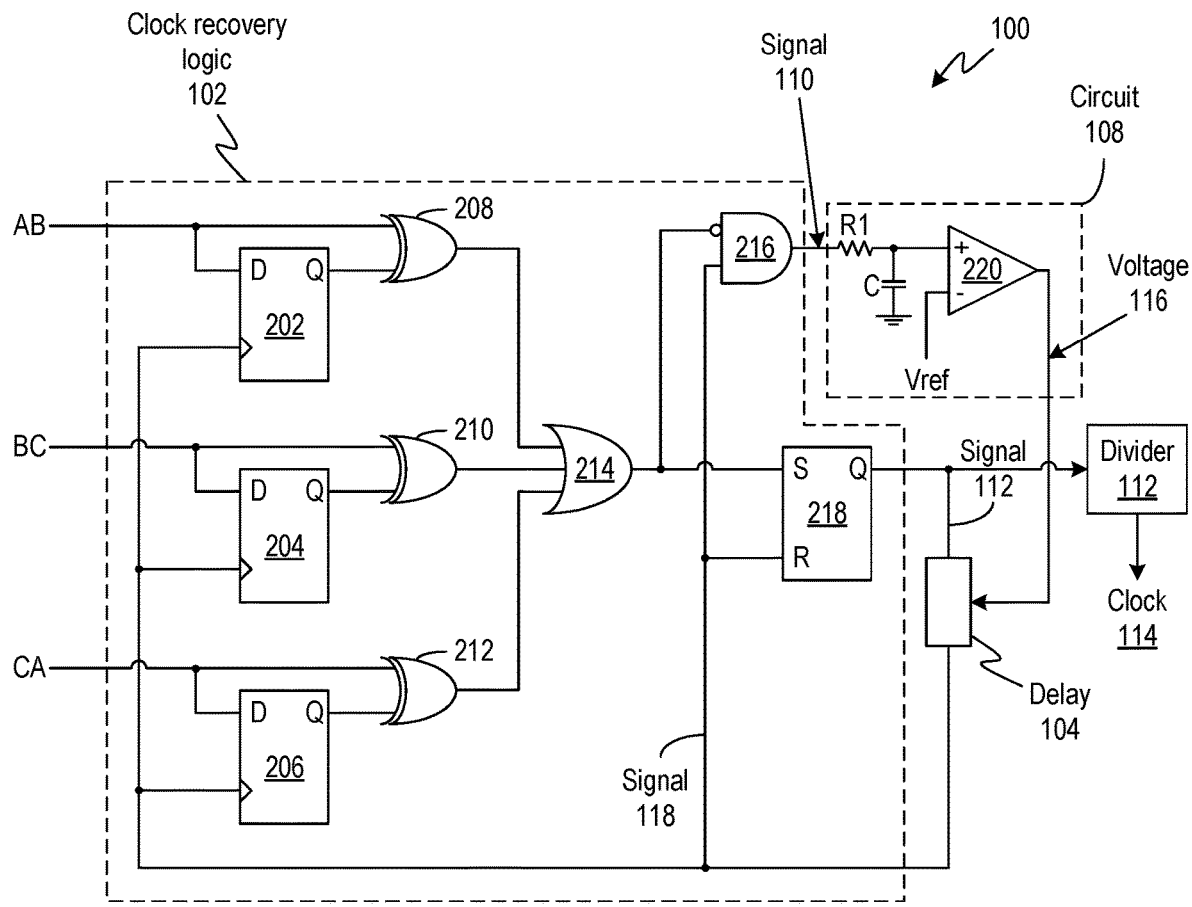
FIG. 2 illustrates an implementation of a clock recovery circuit with analog drift tracking in accordance with some embodiments described herein.

FIG. 2 illustrates an implementation of a clock recovery circuit with analog drift tracking in accordance with some embodiments described herein. Clock recovery logic 102 may include D flip-flops 202, 204, and 206, exclusive-OR gates 208, 210, and 212, OR gate 214, logic gate 216, and SR latch 218. Circuit 108 may include resistance R1, capacitance C, and amplifier 220.

D flip-flop 202 and exclusive-OR gate 208 detects a transition in data signal AB. Specifically, exclusive-OR gate 208 may perform an exclusive-OR operation on a previous value of data signal AB that was latched in D flip-flop 202 and a current value of data signal AB, and produce a logical "1" output if the two values are different (i.e., if a transition has occurred in data signal AB after the previous value was latched). Likewise, D flip-flop 204 and exclusive-OR gate 210 detects a transition in data signal BC, and D flip-flop 206 and exclusive-OR gate 212 detects a transition in data signal CA. Thus, the outputs of exclusive-OR gates 208, 210, and 212 may transition from a logical "0" to a logical "1" when a transition is detected in data signals AB, BC, and CA, respectively.

OR gate 214 combines the outputs of exclusive-OR gates 208, 210, and 212. Therefore, the output of OR gate 214 transitions from a logical "0" to a logical "1" when a transition is detected in any of the data signals. If two or more data signals AB, BC, and CA transition, then the output of OR gate 214 transitions from a logical "0" to a logical "1" when the earliest transition is detected.

Figure 3:
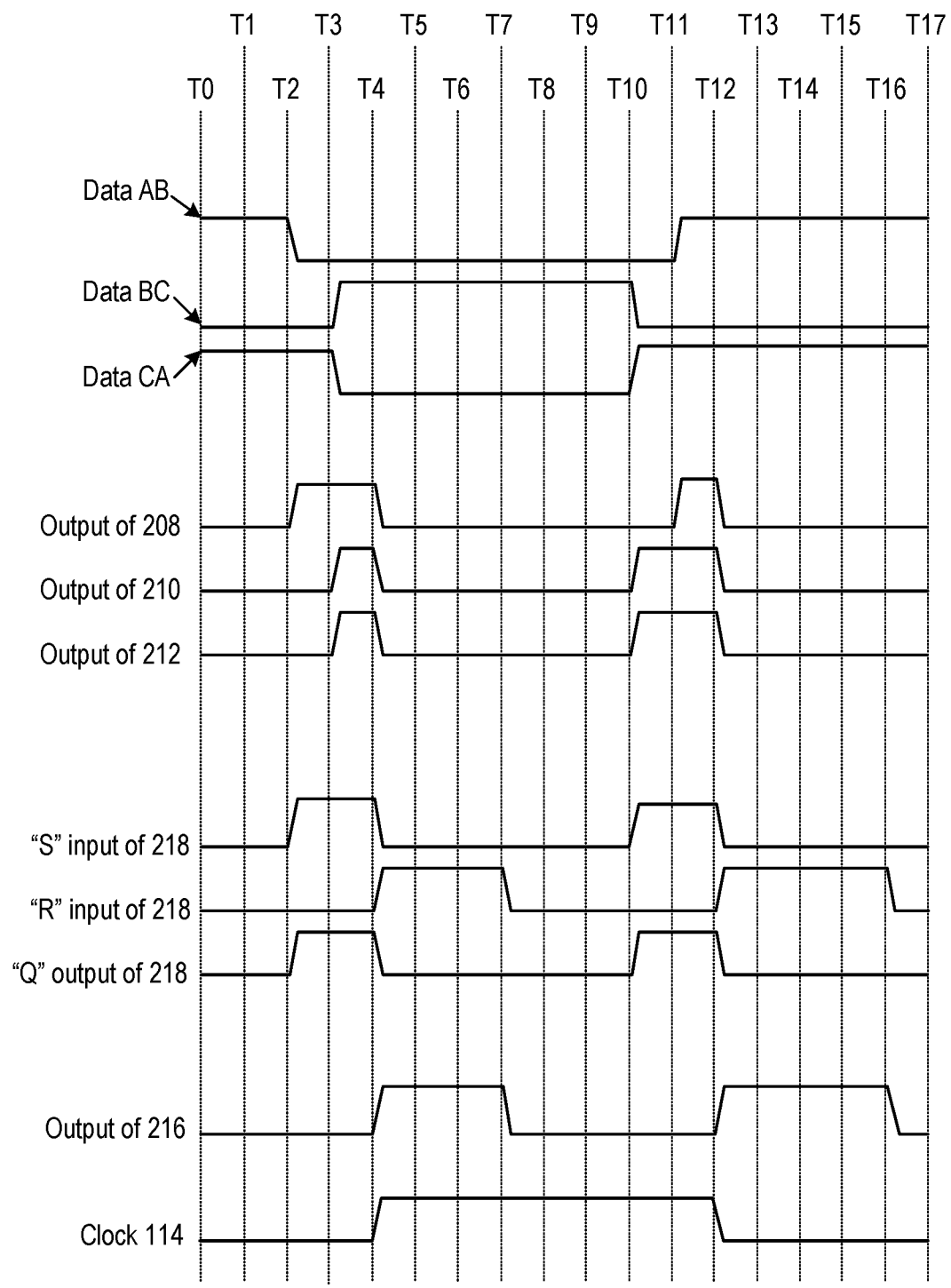
FIG. 3 illustrates signal waveforms for an implementation of a clock recovery circuit with analog drift tracking in accordance with some embodiments described herein.

FIG. 3 illustrates signal waveforms for an implementation of a clock recovery circuit with analog drift tracking in accordance with some embodiments described herein. Specifically, FIG. 3 illustrate signal waveforms for data signals AB, BC, CA, outputs of exclusive-OR gates 208, 210, and 212, "S" and "R" inputs of SR latch 218, "Q" output of SR latch 218, output of logic gate 216, and the recovered clock 114.

As shown in FIG. 3, data signal AB transitions at time instance T2, and data signals BC and CA transition at time instance T3. Outputs of exclusive-OR gates 208, 210, and 212 detect the transitions in data signals AB, BC, and CA, respectively, by outputting a logical "1."

Referring to FIG. 2, the output of OR gate 214 is provided as the "S" input to SR latch 218. Therefore, the "Q" output of SR latch 218 also transitions from a logical "0" to a logical "1" when a transition is detected in any of the data signals. Specifically, if multiple data signals transition, then the "Q" output of SR latch 218 becomes a logical "1" when the earliest transition is detected. It is noted that the "Q" output of SR latch 218 is signal 112. Signal 112 is delayed by delay 104, and the delayed version of signal 112, i.e., signal 118, is provided as a clock signal to D flip-flops 202, 204, and 206. Signal 118 is also provided as the "R" input to SR latch 218. Therefore, the transition from a logical "0" to a logical "1" in signal 112 is delayed by delay 104, and the delayed transition resets SR latch 218. In other words, SR latch 218 transitions from a logical "0" to a logical "1" when the earliest edge is detected in data signals AB, BC, and CA, and SR latch 218 transitions back to a logical "0" after an amount of delay that is determined by delay 104.

Referring to FIG. 3, the "S" input of SR latch 218 transitions from a logical "0" to a logical "1" when the earliest data signal transition occurs. In the example shown in FIG. 3, the earliest data signal edge is that of data signal AB at time instance T2, which coincides with the transition in the "S" input of SR latch 218. The "R" input of SR latch 218 transitions after a specific amount of delay has elapsed from the transition in the "S" input of SR latch 218. This specific delay is the delay amount added by delay 104, which is equal to two time units in the example shown in FIG. 3. Specifically, the "S" input of SR latch 218 transitions at time instance T2, and the "R" input of SR latch 218 transitions at time instance T4. The "Q" output of SR latch 218 transitions from a logical "0" to a logical "1" when the "S" input of SR latch 218 is asserted, i.e., at time instance T2. The "Q" output of SR latch 218 transitions from a logical "1" to a logical "0" when the "R" input of SR latch 218 is asserted, i.e., at time instance T4.

Referring to FIG. 2, logic gate 216 produces signal 110 by performing a logical AND operation between an inverted output of OR gate 214 and signal 118. It is noted that the duty cycle of signal 110 corresponds to a ratio of the delay added by delay 104 and the clock period of signal 118 (which is equal to the clock period of signal 112). The output of logic gate 216 and the clock signal 114 are shown in FIG. 3.

Circuit 108 produces voltage 116 based on signal 110. Specifically, signal 110 is provided to a first input (shown as "+" in FIG. 2) of amplifier 220 through resistor R1. A shunt capacitor C is coupled between the first input and ground. Reference voltage Vref is provided to a second input of amplifier 220. Resistor R1 and capacitor C functions as a low pass filter that averages signal 110. The averaged value of signal 110 is compared with reference voltage Vref, and voltage 116 is produced based on the result of the comparison. Specifically, voltage 116 is proportional to the difference between the averaged value of signal 110 (i.e., the voltage at the first input of amplifier 220) and Vref.

Figure 4:
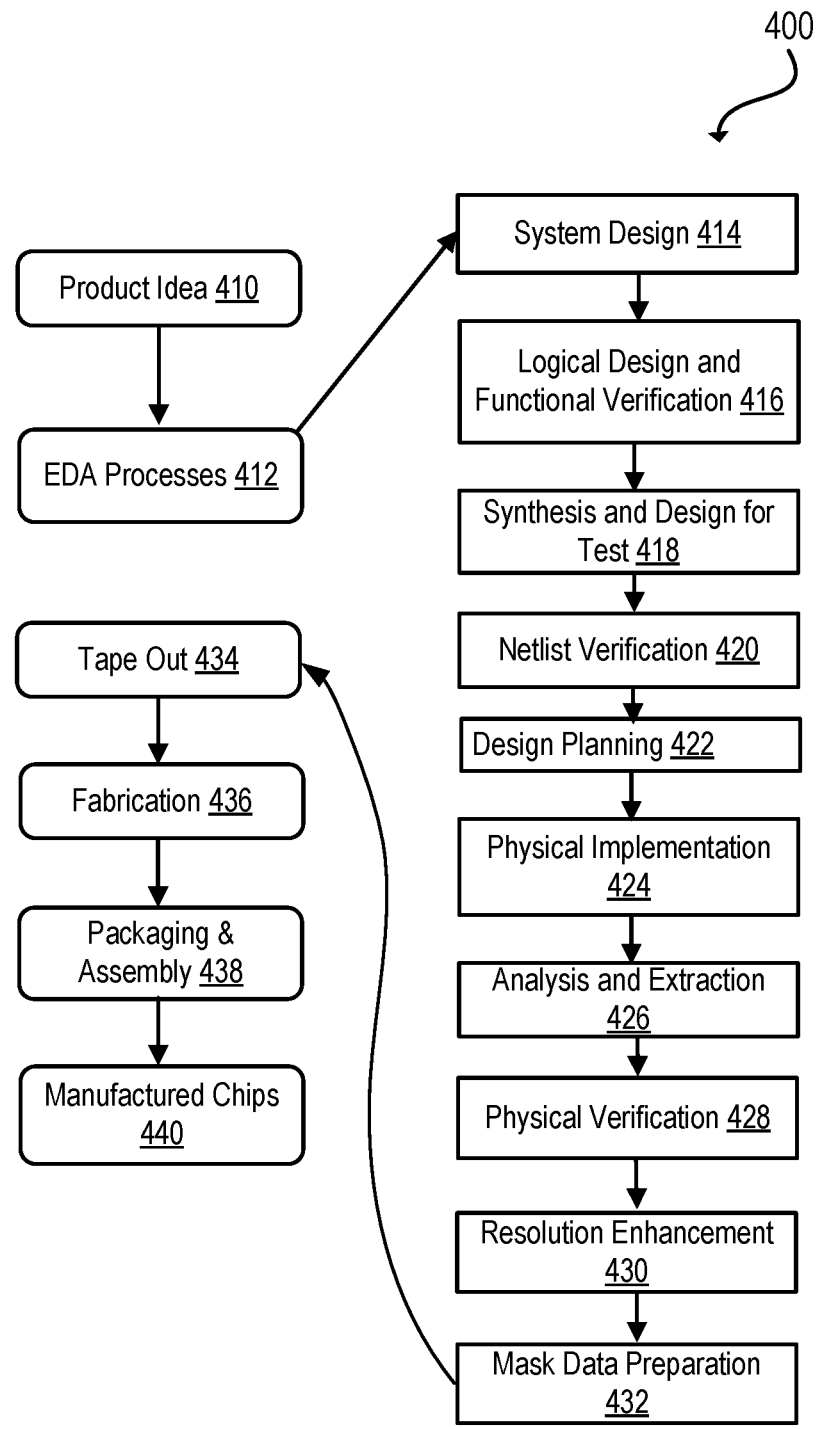
FIG. 4 depicts a flowchart that illustrates an IC design and manufacture flow in accordance with some embodiments described herein.

FIG. 4 illustrates an example flow 400 for the design, verification, and fabrication of an integrated circuit in accordance with some embodiments described herein. EDA processes 412 (the acronym "EDA" refers to "Electronic Design Automation") can be used to transform and verify design data and instructions that represent the integrated circuit. Each of these processes can be structured and enabled as multiple modules or operations.

Flow 400 can start with the creation of a product idea 410 with information supplied by a designer, information which is transformed and verified by using EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly 438 are performed to produce the manufactured IC chip 440.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as test-bench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 500 in FIG. 5) may be used to store the programs and data structures that are used by some or all of the EDA products described herein, and products used for development of cells for the library and for physical and logical design that use the library.

Figure 5:
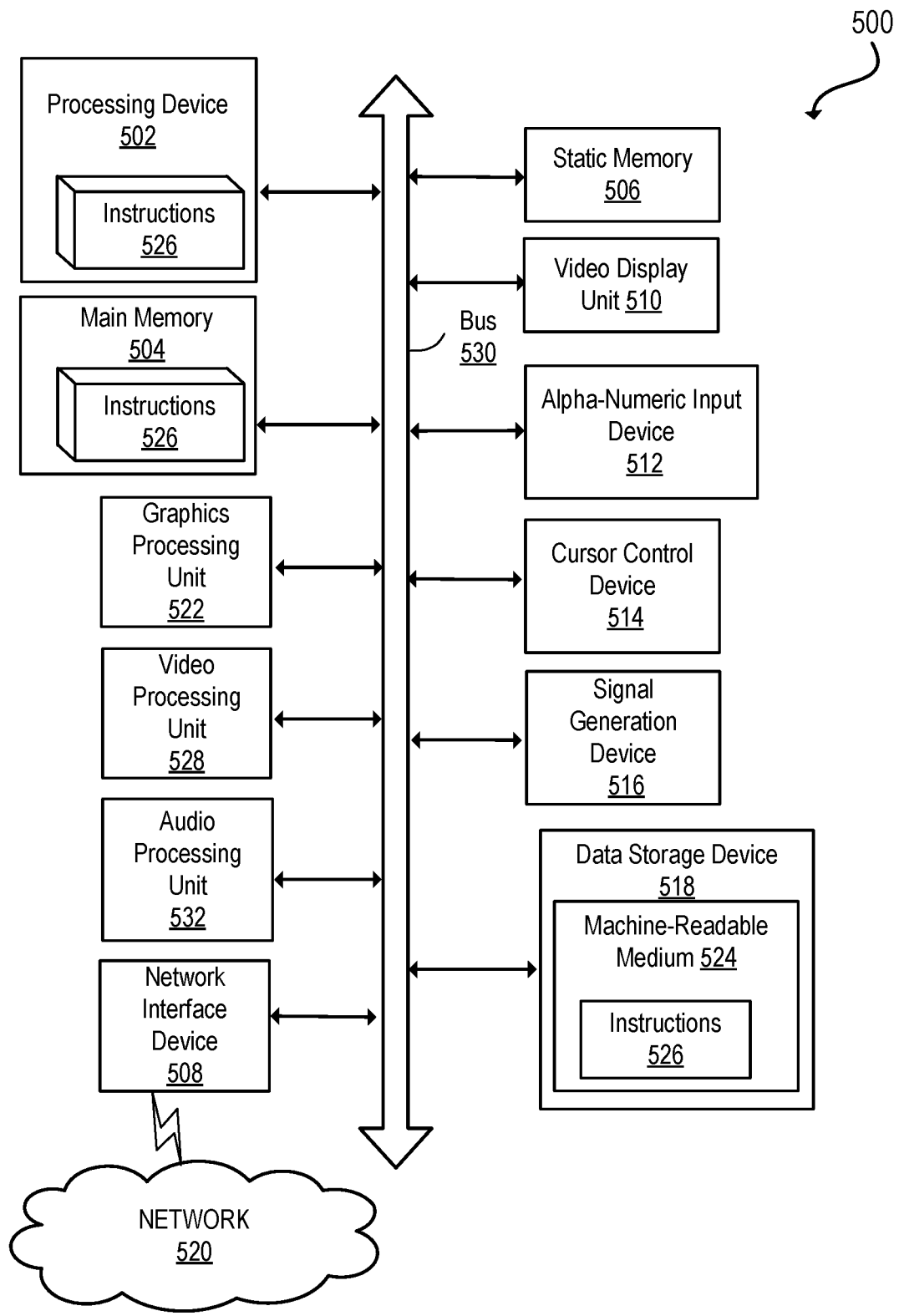
FIG. 5 illustrates an example machine of a computer system within which a set of instructions, for causing the machine to perform any one or more of the methodologies discussed herein, may be executed in accordance with some embodiments described herein.

FIG. 5 illustrates an example machine of a computer system 500 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SRAM), etc.), and a data storage device 518, which communicate with each other via a bus 530.

Processing device 502 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 may be configured to execute instructions 526 for performing the operations and steps described herein.

The computer system 500 may further include a network interface device 508 to communicate over the network 520. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), a graphics processing unit 522, a signal generation device 516 (e.g., a speaker), graphics processing unit 522, video processing unit 528, and audio processing unit 532.

The data storage device 518 may include a machine-readable storage medium 524 (also known as a non-transitory computer-readable medium) on which is stored one or more sets of instructions 526 or software embodying any one or more of the methodologies or functions described herein. The instructions 526 may also reside, completely or at least partially, within the main memory 504 and/or within the processing device 502 during execution thereof by the computer system 500, the main memory 504 and the processing device 502 also constituting machine-readable storage media.

In some implementations, the instructions 526 include instructions to implement functionality corresponding to the present disclosure. While the machine-readable storage medium 524 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 502 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit comprising:
    a first circuit to produce an output signal that is a logical combination of an edge detection signal and a clock signal, wherein at least some transitions in the edge detection signal correspond to transitions in a data signal;
    a second circuit to average the output signal to produce a voltage; and
    a third circuit to add a variable delay to the clock signal based on the voltage.

2. The circuit of claim 1, wherein the second circuit comprises:
    an amplifier having a first input, a second input, and an output;
    a capacitor coupled between the first input and ground; and
    wherein the output signal is provided to the first input through a resistance, a reference voltage is provided to the second input, and the voltage is produced by the output.

3. The circuit of claim 1, wherein the third circuit comprises a first delay element coupled in series with a second delay element, wherein the first delay element is digitally controlled, and wherein the second delay element is controlled based on the voltage.

4. The circuit of claim 3, wherein the second delay element tracks changes in a clock frequency of the clock signal due to voltage drift, temperature drift, or both voltage drift and temperature drift.

5. The circuit of claim 1, comprising a fourth circuit to generate the edge detection signal based on the data signal received using three interconnects, wherein at least a pair of interconnects of the three interconnects includes a transition between successive symbols encoded in the data signal.

6. The circuit of claim 5, wherein 16 bits of data are encoded using seven symbols in the data signal.

7. The circuit of claim 5, wherein the fourth circuit detects a transition in any pair of interconnects of the three interconnects.

8. An apparatus, comprising:
    a set of terminals to receive a data signal;
    a first circuit to generate a first signal based on the data signal;
    a second circuit to produce an output signal that is a logical combination of the first signal and a clock signal;
    a third circuit to average the output signal to produce a voltage; and
    a fourth circuit to add a variable delay to the clock signal based on the voltage.

9. The apparatus of claim 8, wherein the third circuit comprises:
    an amplifier having a first input, a second input, and an output;
    a capacitor coupled between the first input and ground; and
    wherein the output signal is provided to the first input through a resistance, a reference voltage is provided to the second input, and the voltage is produced by the output.

10. The apparatus of claim 9, wherein the fourth circuit comprises a first delay element coupled in series with a second delay element, wherein the first delay element is digitally controlled, and wherein the second delay element is controlled based on the voltage.

11. The apparatus of claim 10, wherein the second delay element tracks changes in a clock frequency of the clock signal due to voltage drift, temperature drift, or both voltage drift and temperature drift.

12. The apparatus of claim 8, wherein a differential signal between at least a pair of terminals of the set of terminals includes a transition between successive symbols encoded in the data signal.

13. The apparatus of claim 12, wherein 16 bits of data are encoded using seven symbols in the data signal.

14. The apparatus of claim 8, wherein the first circuit detects a transition in a differential signal between any pair of terminals of the set of terminals.

15. A method comprising:
generating a first signal based on a data signal received over three signal lines, wherein a differential signal between at least a pair of signal lines of the three signal lines includes a transition between successive symbols encoded in the data signal, and wherein transitions in the differential signal are detected using a clock signal;
generating an output signal that is a logical combination of the first signal and the clock signal;
integrating the output signal to produce a voltage; and
adding a variable delay to the clock signal based on the voltage.

16. The method of claim 15, wherein said integrating the output signal comprises computing an average difference between the output signal and a reference voltage.

17. The method of claim 15, wherein said adding the variable delay to the clock signal based on the voltage comprises adding a first delay based on a digital value, and a second delay based on the voltage.

18. The method of claim 17, wherein the second delay tracks changes in a clock frequency of the clock signal due to voltage drift, temperature drift, or both voltage drift and temperature drift.

19. The method of claim 15, wherein 16 bits of data are encoded using seven symbols in the data signal.

20. The method of claim 15, wherein first signal transitions whenever a transition occurs in any pair of signal lines.

* * * * *